(12) United States Patent
Winter et al.

(10) Patent No.: US 8,498,151 B1
(45) Date of Patent: *Jul. 30, 2013

(54) DATA STORAGE IN ANALOG MEMORY CELLS USING MODIFIED PASS VOLTAGES

(75) Inventors: Shai Winter, Givatayim (IL); Ofir Shalvi, Ra'anana (IL)

(73) Assignee: Apple Inc., Cupertino, CA (US)

( * ) Notice: Subject to any disclaimer, the term of this patent is extended or adjusted under 35 U.S.C. 154(b) by 915 days.

This patent is subject to a terminal disclaimer.

(21) Appl. No.: 12/534,893

(22) Filed: Aug. 4, 2009

Related U.S. Application Data

(60) Provisional application No. 61/086,225, filed on Aug. 5, 2008, provisional application No. 61/187,676, filed on Jun. 17, 2009.

(51) Int. Cl.
*G11C 11/34* (2006.01)
*G11C 16/06* (2006.01)

(52) U.S. Cl.
USPC ............. 365/185.03; 365/185.02; 365/185.09

(58) Field of Classification Search
USPC ........................... 365/185.02, 185.03, 185.09
See application file for complete search history.

(56) References Cited

U.S. PATENT DOCUMENTS

| | | | |
|---|---|---|---|
| 3,668,631 A | 6/1972 | Griffith et al. | |
| 3,668,632 A | 6/1972 | Oldham | |
| 4,058,851 A | 11/1977 | Scheuneman | |
| 4,112,502 A | 9/1978 | Scheuneman | |
| 4,394,763 A | 7/1983 | Nagano et al. | |
| 4,413,339 A | 11/1983 | Riggle et al. | |
| 4,556,961 A | 12/1985 | Iwahashi et al. | |
| 4,558,431 A | 12/1985 | Satoh | |
| 4,608,687 A | 8/1986 | Dutton | |
| 4,654,847 A | 3/1987 | Dutton | |
| 4,661,929 A | 4/1987 | Aoki et al. | |
| 4,768,171 A | 8/1988 | Tada | |
| 4,811,285 A | 3/1989 | Walker et al. | |
| 4,899,342 A | 2/1990 | Potter et al. | |

(Continued)

FOREIGN PATENT DOCUMENTS

| EP | 0783754 B1 | 7/1997 |
|---|---|---|
| EP | 1434236 B1 | 6/2004 |

(Continued)

OTHER PUBLICATIONS

U.S. Appl. No. 12/323,544 Office Action dated Dec. 13, 2011.

(Continued)

*Primary Examiner* — Toan Le
(74) *Attorney, Agent, or Firm* — Meyertons, Hood, Kivlin, Kowert & Goetzel, P.C.

(57) ABSTRACT

A method for data storage includes storing data in a target analog memory cell, which is one of a group of analog memory cells that are connected in series with one another, by writing a storage value into the target memory cell. The storage value written into the target memory cell is verified while biasing the other memory cells in the group with respective first pass voltages. After writing and verifying the storage value, the storage value is read from the target memory cell while biasing the other memory cells in the group with respective second pass voltages, wherein at least one of the second pass voltages applied to one of the other memory cells in the group is lower than a respective first pass voltage applied to the one of the other memory cells. The data is reconstructed responsively to the read storage value.

40 Claims, 4 Drawing Sheets

U.S. PATENT DOCUMENTS

| | | |
|---|---|---|
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotta et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koening |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny et al. |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzalez et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,732,250 B2 | 5/2004 | Durrant |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,804,805 B2 | 10/2004 | Rub |
| 6,807,095 B2 | 10/2004 | Chen et al. |
| 6,807,101 B2 | 10/2004 | Ooishi et al. |
| 6,809,964 B2 | 10/2004 | Moschopoulos et al. |

| Patent | Date | Inventor |
|---|---|---|
| 6,819,592 B2 | 11/2004 | Noguchi et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,851,081 B2 | 2/2005 | Yamamoto |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,870,773 B2 | 3/2005 | Noguchi et al. |
| 6,873,552 B2 | 3/2005 | Ishii et al. |
| 6,879,520 B2 | 4/2005 | Hosono et al. |
| 6,882,567 B1 | 4/2005 | Wong |
| 6,894,926 B2 | 5/2005 | Guterman et al. |
| 6,907,497 B2 | 6/2005 | Hosono et al. |
| 6,925,009 B2 | 8/2005 | Noguchi et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,958,938 B2 | 10/2005 | Noguchi et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 6,999,344 B2 | 2/2006 | Hosono et al. |
| 7,002,843 B2 | 2/2006 | Guterman et al. |
| 7,006,379 B2 | 2/2006 | Noguchi et al. |
| 7,012,835 B2 | 3/2006 | Gonzalez et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,072,222 B2 | 7/2006 | Ishii et al. |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,145,805 B2 | 12/2006 | Ishii et al. |
| 7,151,692 B2 | 12/2006 | Wu |
| 7,158,058 B1 | 1/2007 | Yu |
| 7,170,781 B2 | 1/2007 | So et al. |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzalez et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,644 B1 | 3/2007 | Anderson et al. |
| 7,196,928 B2 | 3/2007 | Chen |
| 7,196,933 B2 | 3/2007 | Shibata |
| 7,197,594 B2 | 3/2007 | Raz et al. |
| 7,200,062 B2 | 4/2007 | Kinsely et al. |
| 7,210,077 B2 | 4/2007 | Brandenberger et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,254,763 B2 | 8/2007 | Aadsen et al. |
| 7,257,027 B2 | 8/2007 | Park |
| 7,259,987 B2 | 8/2007 | Chen et al. |
| 7,266,026 B2 | 9/2007 | Gongwer et al. |
| 7,266,069 B2 | 9/2007 | Chu |
| 7,269,066 B2 | 9/2007 | Nguyen et al. |
| 7,272,757 B2 | 9/2007 | Stocken |
| 7,274,611 B2 | 9/2007 | Roohparvar |
| 7,277,355 B2 | 10/2007 | Tanzana |
| 7,280,398 B1 | 10/2007 | Lee |
| 7,280,409 B2 | 10/2007 | Misumi et al. |
| 7,280,415 B2 | 10/2007 | Hwang et al. |
| 7,283,399 B2 | 10/2007 | Ishii et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,269 B2 | 12/2007 | Shibata |
| 7,310,271 B2 | 12/2007 | Lee |
| 7,310,272 B1 | 12/2007 | Mokhlesi et al. |
| 7,310,347 B2 | 12/2007 | Lasser |
| 7,312,727 B1 | 12/2007 | Feng et al. |
| 7,321,509 B2 | 1/2008 | Chen et al. |
| 7,328,384 B1 | 2/2008 | Kulkarni et al. |
| 7,342,831 B2 | 3/2008 | Mokhlesi et al. |
| 7,343,330 B1 | 3/2008 | Boesjes et al. |
| 7,345,924 B2 | 3/2008 | Nguyen et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,365,671 B1 | 4/2008 | Anderson |
| 7,388,781 B2 | 6/2008 | Litsyn et al. |
| 7,397,697 B2 | 7/2008 | So et al. |
| 7,405,974 B2 | 7/2008 | Yaoi et al. |
| 7,405,979 B2 | 7/2008 | Ishii et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,409,623 B2 | 8/2008 | Baker et al. |
| 7,420,847 B2 | 9/2008 | Li |
| 7,433,231 B2 | 10/2008 | Aritome |
| 7,433,697 B2 | 10/2008 | Karaoguz et al. |
| 7,434,111 B2 | 10/2008 | Sugiura et al. |
| 7,437,498 B2 | 10/2008 | Ronen |
| 7,440,324 B2 | 10/2008 | Mokhlesi |
| 7,440,331 B2 | 10/2008 | Hemink |
| 7,441,067 B2 | 10/2008 | Gorobetz et al. |
| 7,447,970 B2 | 11/2008 | Wu et al. |
| 7,450,421 B2 | 11/2008 | Mokhlesi et al. |
| 7,453,737 B2 | 11/2008 | Ha |
| 7,457,163 B2 | 11/2008 | Hemink |
| 7,457,897 B1 | 11/2008 | Lee et al. |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,469,049 B1 | 12/2008 | Feng |
| 7,471,581 B2 | 12/2008 | Tran et al. |
| 7,483,319 B2 | 1/2009 | Brown |
| 7,487,329 B2 | 2/2009 | Hepkin et al. |
| 7,487,394 B2 | 2/2009 | Forhan et al. |
| 7,492,641 B2 | 2/2009 | Hosono et al. |
| 7,508,710 B2 | 3/2009 | Mokhlesi |
| 7,526,711 B2 | 4/2009 | Orio |
| 7,539,061 B2 | 5/2009 | Lee |
| 7,539,062 B2 | 5/2009 | Doyle |
| 7,551,492 B2 | 6/2009 | Kim |
| 7,558,109 B2 | 7/2009 | Brandman et al. |
| 7,558,839 B1 | 7/2009 | McGovern |
| 7,568,135 B2 | 7/2009 | Cornwell et al. |
| 7,570,520 B2 | 8/2009 | Kamei et al. |
| 7,574,555 B2 | 8/2009 | Porat et al. |
| 7,590,002 B2 | 9/2009 | Mokhlesi et al. |
| 7,593,259 B2 | 9/2009 | Kim et al. |
| 7,594,093 B1 | 9/2009 | Kancherla |
| 7,596,707 B1 | 9/2009 | Vemula |
| 7,609,787 B2 | 10/2009 | Jahan et al. |
| 7,613,043 B2 | 11/2009 | Cornwell et al. |

| | | |
|---|---|---|
| 7,616,498 B2 | 11/2009 | Mokhlesi et al. |
| 7,619,918 B2 | 11/2009 | Aritome |
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 | 9/2010 | Neuman |
| 7,810,017 B2 | 10/2010 | Radke |
| 7,848,149 B2 | 12/2010 | Gonzalez et al. |
| 7,869,273 B2 | 1/2011 | Lee et al. |
| 7,885,119 B2 | 2/2011 | Li |
| 7,904,783 B2 | 3/2011 | Brandman et al. |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,978,516 B2 | 7/2011 | Olbrich et al. |
| 7,995,388 B1 * | 8/2011 | Winter et al. ............ 365/185.03 |
| 8,014,094 B1 | 9/2011 | Jin |
| 8,037,380 B2 | 10/2011 | Cagno et al. |
| 8,040,744 B2 | 10/2011 | Gorobets et al. |
| 8,065,583 B2 | 11/2011 | Radke |
| 8,151,166 B2 * | 4/2012 | Shalvi et al. ................. 714/763 |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0104004 A1 | 5/2007 | Opsasnick |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |

| | | |
|---|---|---|
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0240872 A1 | 9/2009 | Perlmutter et al. |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0211803 A1 | 8/2010 | Lablans |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |

FOREIGN PATENT DOCUMENTS

| | | |
|---|---|---|
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
US 7,161,836, Jan. 2007, Wan et al., (withdrawn).
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May 1984, section 3.2, pp. 47-48.
Chang, L ., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW' 2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

U.S. Appl. No. 11/949,135 Official Action dated Oct. 2, 2009.

Sommer, N., U.S. Appl. No. 12/171,797 "Memory Device with Non-Uniform Programming Levels" filed Jul. 11, 2008.

Shalvi et al., U.S. Appl. No. 12/251,471 "Compensation for Voltage Drifts in Analog Memory Cells" filed Oct. 15, 2008.

Sommer et al., U.S. Appl. No. 12/497,707 "Data Storage in Analog Memory Cells with Protection Against Programming Interruption" filed Jul. 6, 2009.

Winter et al., U.S. Appl. No. 12/534,898 "Data Storage Using Modified Voltages" filed Aug. 4, 2009.

U.S. Appl. No. 11/995,814 Official Action dated Dec. 17, 2010.

U.S. Appl. No. 12/388,528 Official Action dated Nov. 29, 2010.

U.S. Appl. No. 12/251,471 Official Action dated Jan. 3, 2011.

Engineering Windows 7, "Support and Q&A for Solid-State Drives", e7blog, May 5, 2009.

Micron Technology Inc., "Memory Management in NAND Flash Arrays", Technical Note, year 2005.

Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Park et al., "Sub-Grouped Superblock Management for High-Performance Flash Storages", IEICE Electronics Express, vol. 6, No. 6, pp. 297-303, Mar. 25, 2009.

"How to Resolve "Bad Super Block: Magic Number Wrong" in BSD", Free Online Articles Director Article Base, posted Sep. 5, 2009.
Ubuntu Forums, "Memory Stick Failed IO Superblock", posted Nov. 11, 2009.
Super User Forums, "SD Card Failure, can't read superblock", posted Aug. 8, 2010.
U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
U.S. Appl. No. 12/019,011 Official Action dated Nov. 20, 2009.
Takeuchi et al., "A Multipage Cell Architecture for High-Speed Programming Multilevel NAND Flash Memories", IEEE Journal of Solid State Circuits, vol. 33, No. 8, Aug. 1998.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2009.
SAS Protocol, "Information Technology—Serial Attached SCSI—2 (SAS-2)", INCITS document T10/1760-D, revision 15a, Feb. 22, 2009.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed Jun. 24, 2010.
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
Wei, L., "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
Jedec Standard JESD84-C44, "Embedded MultiMediaCard (e•MMC) Mechanical Standard, with Optional Reset Signal", Jedec Solid State Technology Association, USA, Jul. 2009.
Jedec, "UFS Specification", version 0.1, Nov. 11, 2009.
SD Group and SD Card Association, "SD Specifications Part 1 Physical Layer Specification", version 3.01, draft 1.00, Nov. 9, 2009.
Compaq et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.

* cited by examiner

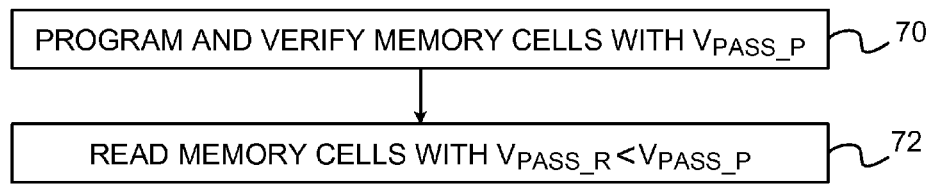
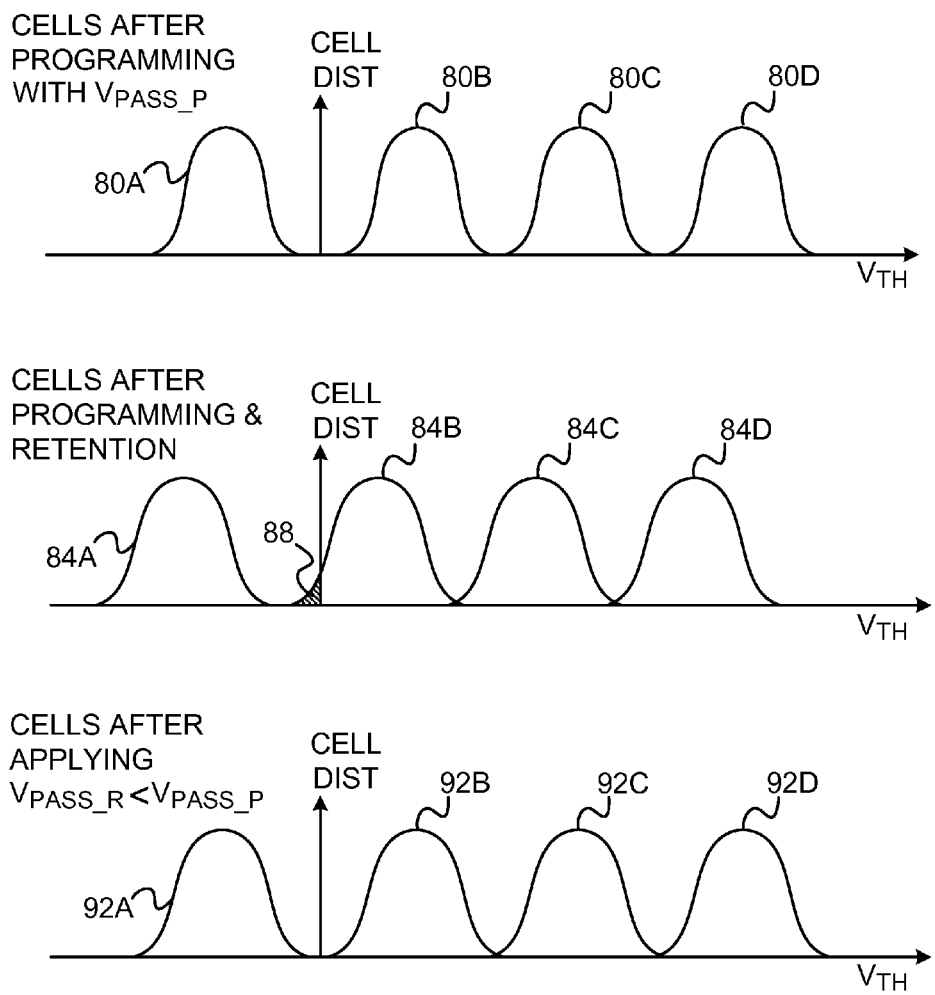

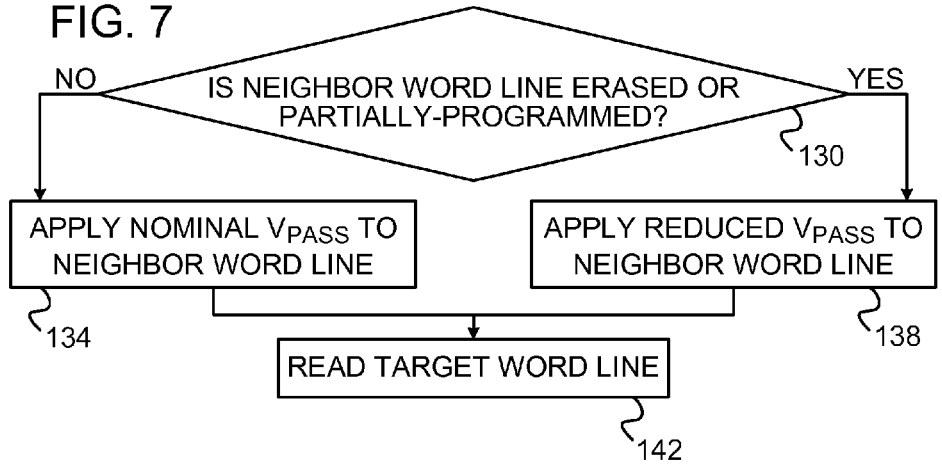
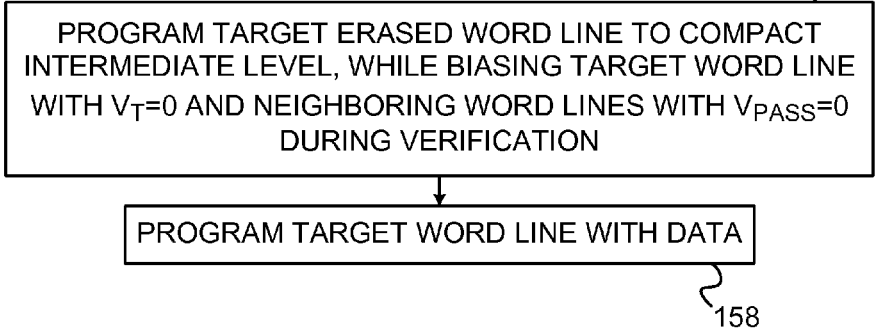
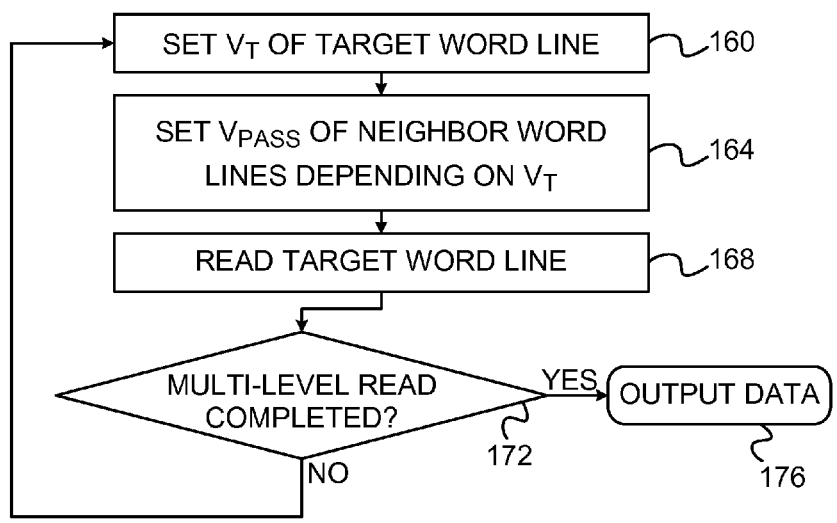

DATA STORAGE IN ANALOG MEMORY CELLS USING MODIFIED PASS VOLTAGES

CROSS-REFERENCE TO RELATED APPLICATIONS

This application claims the benefit of U.S. Provisional Patent Application 61/086,225, filed Aug. 5, 2008, and U.S. Provisional Patent Application 61/187,676, filed Jun. 17, 2009, whose disclosures are incorporated herein by reference. This application is related to a U.S. patent application entitled "Data Storage Using Modified Voltages," which is filed on even date and whose disclosure is incorporated herein by reference.

FIELD OF THE INVENTION

The present invention relates generally to memory devices, and particularly to methods and systems for setting pass voltages in programming and readout of analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

SUMMARY OF THE INVENTION

An embodiment of the present invention provides a method for data storage, including:

storing data in a target analog memory cell, which is one of a group of analog memory cells that are connected in series with one another, by writing a storage value into the target memory cell;

verifying the storage value written into the target memory cell while biasing the other memory cells in the group with respective first pass voltages;

after writing and verifying the storage value, reading the storage value from the target memory cell while biasing the other memory cells in the group with respective second pass voltages, wherein at least one of the second pass voltages applied to one of the other memory cells in the group is lower than a respective first pass voltage applied to the one of the other memory cells; and reconstructing the data responsively to the read storage value.

In an embodiment, the analog memory cells include NAND Flash memory cells, and the group of the analog memory cells includes a NAND string. In a disclosed embodiment, biasing the other memory cells in the group includes applying the lower at least one of the second pass voltages to a memory cell that neighbors the target memory cell.

In some embodiments, biasing the other memory cells includes identifying a subset of the other memory cells in the group, which are unlikely to affect an electrical conductance of the group when biased with the lower at least one of the second pass voltages, and selectively applying the lower at least one of the second pass voltages only to the memory cells in the subset. In an embodiment, the memory cells include multi-level analog memory cells that are each configured to store a predefined number of bits, and identifying the subset includes identifying the memory cells in the group that store less than the predefined number of bits. In an embodiment, the memory cells include multi-level analog memory cells that are each programmed to one of multiple predefined storage value ranges, and identifying the subset includes identifying the memory cells in the group that are programmed to less than a highest range among the storage value ranges.

In some embodiments, at a time of reading the storage value from the target memory cell while biasing the one of the other memory cells with the first pass voltage, the storage value is lower than a minimum readable value, and biasing the one of the other memory cells with the second pass voltage includes reducing the minimum readable value. In an embodiment, the minimum readable value is zero while biasing the one of the other memory cells with the first pass voltage. In another embodiment, reading the storage value includes sensing an electrical conductance of the group of the memory cells while applying a non-negative read voltage to the target memory cell.

In yet another embodiment, reading the storage value includes applying a read voltage to the target memory cell, and biasing the other memory cells includes setting the at least one of the second pass voltages depending on the read voltage. In still another embodiment, reading the storage value includes applying a read voltage to the target memory cell, and biasing the other memory cells includes applying the read voltage to the one of the other memory cells. In an embodiment, the method includes applying the lower at least one of the second pass voltages only responsively to a failure to reconstruct the data while biasing the other memory cells in the group with the first pass voltages.

In some embodiments, the memory cells are included in a memory device, and biasing the other memory cells includes instructing the memory device, using a processor separate from the memory device, to apply the at least one of the second pass voltages. In an embodiment, biasing the other memory cells includes programming a neighboring memory cell in the group to a given storage value, and biasing the neighboring memory cell with a given pass voltage in a vicinity of the given storage value.

There is additionally provided, in accordance with an embodiment of the present invention, a method for data storage, including:

storing data in a target analog memory cell that is one of a group of multi-level analog memory cells, which are each configured to store a respective storage value belonging to a storage value range selected from multiple predefined ranges and which are connected in series with one another, by writing an input storage value into the target memory cell; and reading an output storage value from the target memory cell while biasing the other memory cells in the group with respective pass voltages so as to reconstruct the data, wherein at least one of the pass voltages, which biases at least one of the other memory cells in the group, is set according to the storage value range to which the at least one of the other memory cells belongs.

In some embodiments, biasing the other memory cells in the group includes setting the at least one of the pass voltages to a first value upon determining that the at least one of the other memory cells is programmed to a first storage value range, and setting the at least one of the pass voltages to a second value, lower than the first value, upon determining that the at least one of the other memory cells is programmed to a second storage value range, lower than the first range.

There is also provided, in accordance with an embodiment of the present invention, a method for data storage, including:

storing data in a target analog memory cell, which is one of a group of analog memory cells that are connected in series with one another, by writing an input storage value into the target memory cell;

after storing the data, reading an output storage value from the target memory cell using a read threshold, so as to reconstruct at least some of the data; and while reading the output storage value, biasing at least one of the memory cells in the group, other than the target memory cell, with a pass voltage that depends on the read threshold.

In an embodiment, the at least one of the memory cells includes a memory cell that neighbors the target memory cell.

There is further provided, in accordance with an embodiment of the present invention apparatus for data storage, including:

an interface, which is operative to communicate with a memory including a group of analog memory cells that are connected in series with one another; and circuitry, which is configured to store data in a target analog memory cell in the group by writing a storage value into the target memory cell, to verify the storage value written into the target memory cell while biasing the other memory cells in the group with respective first pass voltages, to read the storage value from the target memory cell, after writing and verifying the storage value, while biasing the other memory cells in the group with respective second pass voltages, wherein at least one of the second pass voltages applied to one of the other memory cells in the group is lower than a respective first pass voltage applied to the one of the other memory cells, and to reconstruct the data responsively to the read storage value.

There is additionally provided, in accordance with an embodiment of the present invention, apparatus for data storage, including:

an interface operative to communicate with a memory including a group of multi-level analog memory cells, which are each configured to store a respective storage value belonging to a storage value range selected from multiple predefined ranges and which are connected in series with one another; and circuitry, which is configured to store data in a target analog memory cell in the group by writing an input storage value into the target memory cell, and to read an output storage value from the target memory cell while biasing the other memory cells in the group with respective pass voltages so as to reconstruct the data, wherein at least one of the pass voltages, which biases at least one of the other memory cells in the group, is set according to in the storage value range to which the at least one of the other memory cells belongs.

There is also provided, in accordance with an embodiment of the present invention, apparatus for data storage, including:

an interface, which is operative to communicate with a memory including a group of analog memory cells that are connected in series with one another; and circuitry, which is configured to store data in a target analog memory cell in the group by writing an input storage value into the target memory cell, to read, after storing the data, an output storage value from the target memory cell using a read threshold so as to reconstruct at least some of the data, and, while reading the output storage value, to bias at least one of the memory cells in the group, other than the target memory cell, with a pass voltage that depends on the read threshold.

The present invention will be more fully understood from the following detailed description of the embodiments thereof, taken together with the drawings in which:

BRIEF DESCRIPTION OF THE DRAWINGS

FIG. 3 is a flow chart that schematically illustrates a method for data storage in analog memory cells, in accordance with an embodiment of the present invention;

FIG. 4 is a graph showing threshold voltage distributions in a group of analog memory cells, in accordance with an embodiment of the present invention;

FIGS. 5-7 are flow charts that schematically illustrate methods for reading analog memory cells, in accordance with embodiments of the present invention;

FIG. 8 is a flow chart that schematically illustrates a method for pre-programming analog memory cells, in accordance with an embodiment of the present invention; and FIG. 9 is a flow chart that schematically illustrates a method for reading multi-level analog memory cells, in accordance with an embodiment of the present invention.

DETAILED DESCRIPTION OF EMBODIMENTS

Overview

Figure 1:
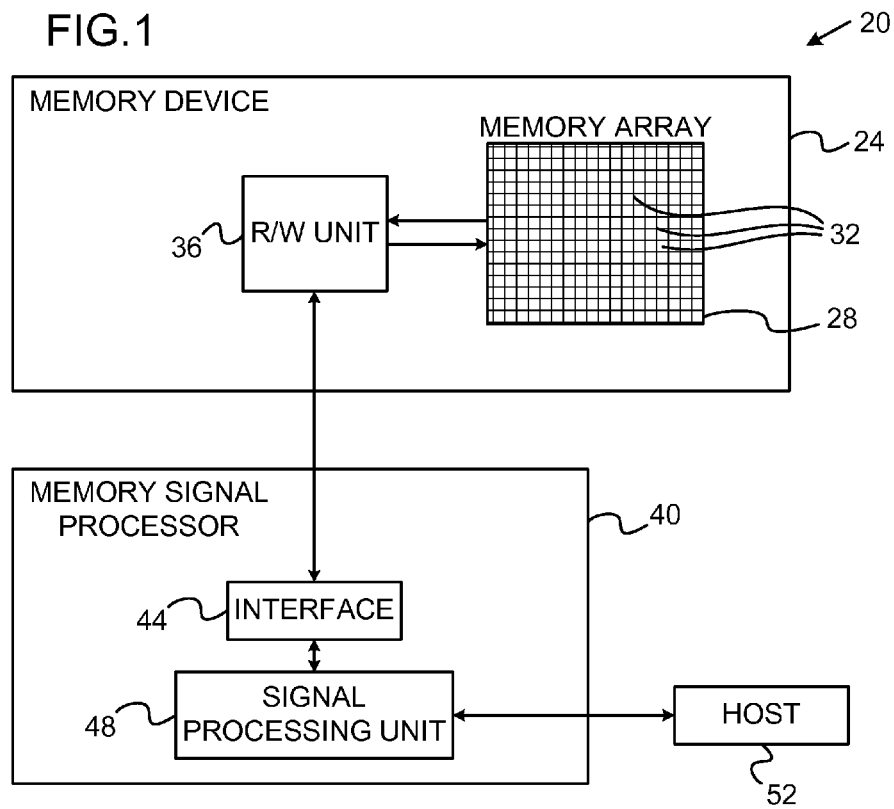
FIG. 1 is a block diagram that schematically illustrates a memory system, in accordance with an embodiment of the present invention.

Data is typically stored in analog memory cells by programming the cells to assume certain quantities of an analog value, also referred to as a storage value, such as an electrical charge or voltage. The analog value stored in the cell can be read by measuring the threshold voltage of the cell, which is defined as the minimal voltage that needs to be applied to the cells' gate in order to cause the cell to reach a given level of electrical conductance.

In many memory devices, analog memory cells are arranged in strings. Each string comprises a group of floating-gate memory cells that are connected source-to-drain in series with one another. This sort of configuration is common, for example, in NAND Flash devices. A particular memory cell can be read by (1) applying a read voltage to the cell's gate, (2) applying respective "pass voltages" to the other memory cells in the string, and (3) measuring the electrical conductance of the string. A memory cell that is read in a certain read operation is referred to herein as a target cell or a selected cell. The other cells in the string, to which the pass voltages are applied, are referred to herein as unselected cells.

Memory devices are often designed to read a plurality of target cells simultaneously (e.g., on the order of 32,000 cells in some NAND Flash devices), wherein each target cell belongs to a different string. The threshold voltage of a given memory cell within a string is sometimes defined as the minimal voltage, which needs to be applied to the cells' gate in order to cause the cell to reach a given level of electrical conductance, assuming the gates of the other cells in the string are biased with nominal pass voltages.

The pass voltages are usually selected to be sufficiently high so that the unselected memory cells in the string will conduct regardless of their charge levels. The read voltage, on the other hand, is typically set to a value lower than the pass voltage, and the value of the read voltage is chosen so that the conductance of the target cell will depend on the charge level of the target cell. In other words, the pass voltages and read voltage are selected so that the conductance of the string will reflect the charge level of the target cell in comparison with the read voltage, regardless of the charge levels of the unselected cells.

Embodiments of the present invention provide improved methods and systems for setting the values of pass voltages used in programming and data readout operations. These methods and systems improve the reading performance of analog memory cell devices.

In some embodiments, data is stored in the target memory cell using an iterative Programming and Verification (P&V) process. For at least one of the unselected cells in the string, the pass voltage applied during data readout is lower than the pass voltage applied during programming verification. Lowering the pass voltage during data readout has an effect of increasing the effective read voltage at the target cell's gate. This effect is important, for example, for reading memory cells that were initially programmed to positive threshold voltages but whose threshold voltages drifted over time and became negative. When the threshold voltage of a given memory cell drifts over time and becomes negative, reading this cell while applying reduced pass voltage to unselected cells enables reliable readout using positive read voltages.

In some cases, reducing the pass voltage creates a risk that some unselected cells will stop conducting, and will therefore modify the conductance of the string and distort the read operation. This risk applies particularly to memory cells that reach high threshold voltages, either intentionally or as a result of unintentional over-programming. In some embodiments, reduction of pass voltages is performed selectively, i.e., only to a subset of the unselected cells. Several methods for identifying cells or strings whose conductance is likely to be affected by pass voltage reduction are described herein.

Another technique that is described herein uses reduced pass voltages to pre-program memory cells to an intermediate programming state before data storage. This technique improves programming accuracy and reduces cross-coupling interference between memory cells. Yet another disclosed method improves the resolution of setting the read voltage by jointly setting the read voltage and pass voltages. In still another method, pass voltage values are set as a function of the read threshold used in the read operation, so as to increase the maximum achievable read voltage.

The methods described herein can be carried out by internal circuitry in the memory device, and/or by an external controller. In some embodiments, the memory device and memory controller support a command interface for instructing the memory device to apply the appropriate pass voltages.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 32 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 encodes the data for storage using a suitable Error Correction Code (ECC) and decodes the ECC of data retrieved from the memory. In some embodiments, unit 48 produces the storage values for storing in the memory cells and provides these values to R/W unit 36. Alternatively, unit 48 provides the data for storage, and the conversion to storage values is carried out by the R/W unit internally to the memory device. Alternatively to using an MSP, the methods described herein can be carried out by any suitable type of memory controller.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and the MSP may be integrated on separate semiconductor dies in a single Multi-Chip Package (MCP) or System on Chip (SoC), and may be interconnected by an internal bus. Further alternatively, some or all of the MSP circuitry may reside on the same die on which the memory array is disposed. Further alternatively, some or all of the functionality of MSP 40 can be implemented in software and carried out by a processor or other element of the host system. In some embodiments, host 44 and MSP 40 may be fabricated on the same die, or on separate dies in the same device package.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. In some embodiments, the transistors along each column are divided into serially-connected strings, as will be explained in detail further below.

The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

Memory Cell Strings and Word-Line Biasing

Figure 2:
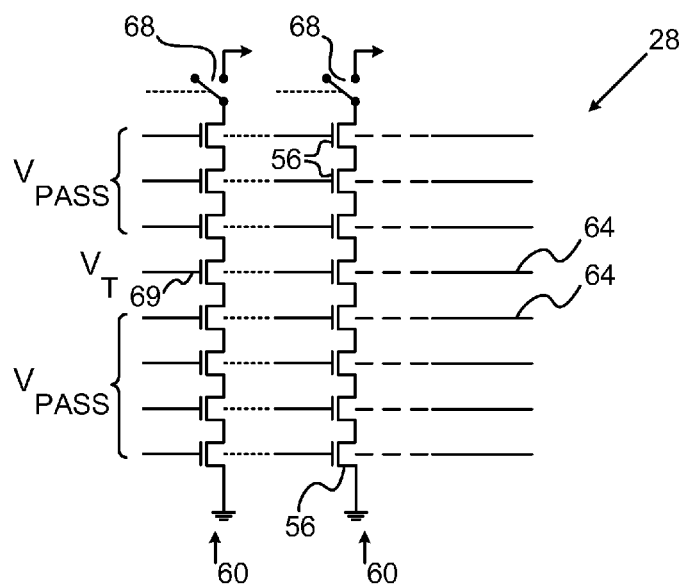
FIG. 2 is a circuit diagram that schematically illustrates an analog memory cell array, in accordance with an embodiment of the present invention.

FIG. 2 is a circuit diagram that schematically illustrates an example implementation of memory cell array 28, in accordance with an embodiment of the present invention. In the present example, each memory cell comprises a floating gate Metal-Oxide Semiconductor (MOS) transistor 56. The memory cells in each column of array (i.e., the memory cells of each bit line) are divided into groups, which are referred to as strings 60. Grouping of memory cells in strings is typical of NAND Flash memory devices, in which the strings are commonly referred to as NAND strings. A NAND string may comprise any suitable number of memory cells, e.g., thirty-two cells.

A certain amount of electrical charge (electrons or holes) can be stored in a particular cell by applying appropriate voltage levels to the transistor gate, source and drain. The value stored in the cell can be read by measuring the threshold voltage of the cell (denoted $V_{TH}$), which is defined as the minimal voltage that needs to be applied to the gate of the transistor in order to cause the transistor to reach a given level of electrical conductance, assuming the gates of the other cells in the string are biased with nominal pass voltages. The read threshold voltage is indicative of the charge stored in the cell.

In each string 60, the memory cells (transistors 56) are connected source-to-drain in series with one another. The source of the first memory cell in the string is connected to the bit line via a string selection switch 68. The string selection switch is controlled by R/W unit 36, which typically closes the switch when accessing memory cells in the strings and opens the switch otherwise. (A given bit line is typically connected to multiple strings.) The drain of the last memory cell in the string is connected to ground. Gates 69 of the memory cells along each row of the array are connected to a respective word line 64. As can be seen in the figure, each memory cell in the row belongs to a different string.

R/W unit 36 typically reads the threshold voltage of a given memory cell (which represents the charge level, and thus the data stored in the cell) by:

Applying a read voltage, denoted $V_T$, to the word line to which the memory cell belongs. This word line is referred to as a selected word line or target word line.

Applying a pass voltage, denoted $V_{PASS}$, to the word lines to which the other memory cells in the string belong. These word lines are referred to as unselected word lines.

Pre-charging the bit line in question.

Connecting the string to which the memory cell belongs to the bit line using the appropriate string select switch 68.

Measuring the electrical conductance of the string by allowing it to discharge and sensing the bit line current after a certain time period. The string conductance under these conditions is indicative of the charge level of the memory cell belonging to the selected word line.

This sort of read operation is typically applied in parallel to multiple cells along a given word line, often to the entire word line. Reading a memory cell by applying voltage $V_T$ forms a certain read threshold, and the result of the read operation indicates whether the threshold voltage of the read memory cell is lower than $V_T$ (in which case the string will conduct) or higher than $V_T$ (in which case the string will not conduct). The pass voltages $V_{PASS}$ are typically selected to be sufficiently high, so that the memory cells other than the cell being read will conduct regardless of their charge levels threshold voltages.

Programming and Reading Memory Cells with Different Pass Voltages

In some embodiments, R/W unit 36 programs a group of memory cells (e.g., an entire word line) by applying an iterative Programming and Verification (P&V) process. In such a process, the R/W unit applies to the word line a sequence of programming pulses, which gradually increase the charge levels of the programmed memory cells. After each programming iteration, the threshold voltages of the memory cells are sensed (verified). Cells that have reached their intended charge levels (threshold voltages) are inhibited from receiving subsequent programming pulses. In each iteration, the R/W unit applies programming pulses selectively. Typically, the R/W unit inhibits memory cells, which have already reached their intended charge levels, from being subjected to subsequent programming pulses.

Thus, R/W unit 36 may read the threshold voltages of memory cells in a given word line in two different scenarios:
- In order to retrieve the data stored in the cells, e.g., in response to a request from the MSP.
- In order to verify the charge levels of the cells, as part of an iterative programming process.

In some embodiments, R/W unit 36 uses certain values of $V_{PASS}$ for read operations that are intended to verify programmed charge levels, and lower $V_{PASS}$ values for read operations that are intended to retrieve data from the memory cells. This condition applies for at least one of the unselected word lines. In some scenarios that are demonstrated below, performing data retrieval using lower pass voltages than those used for programming verification can improve the readout performance, e.g., reduce the probability of read errors.

FIG. 3 is a flow chart that schematically illustrates a method for data storage in analog memory cells, in accordance with an embodiment of the present invention. The method begins with R/W unit 36 storing data in a group of memory cells along a certain word line using an iterative P&V process, at a programming step 70. When verifying the programmed charge levels of the memory cells, the R/W unit applies pass voltages denoted $V_{PASS\_P}$ to the unselected word lines.

At a later point in time, the R/W unit is requested to retrieve the data stored in the group of memory cells.

In response to the request, the R/W unit reads the threshold voltages of the memory cells in the group, at a retrieval step 72. During the data retrieval operation, the R/W unit applies pass voltages denoted $V_{PASS\_R}$ to the unselected word lines.

For at least one of the word lines, the R/W unit uses a certain pass voltage for programming verification, and a lower pass voltage for data retrieval. (Generally, in a given verification or retrieval operation, $V_{PASS}$ values may differ from one unselected word line to another.) Thus, in other words, the R/W unit applies pass voltages to the unselected word lines during programming verification and data retrieval, such that $V_{PASS\_R}<V_{PASS\_P}$ for at least one unselected word line.

FIG. 4 is a graph showing threshold voltage distributions in a group of analog memory cells along a certain word line, in accordance with an embodiment of the present invention. The example of FIG. 4 demonstrates the advantage of performing data retrieval using lower pass voltages. The present example refers to a group of four-level memory cells, each storing two bits of data. The techniques described herein can be used, however, in a similar manner with memory cells that store data in any desired number of programming levels, such as Single-Level Cells (SLC), eight-level cells or sixteen-level cells.

The top graph in FIG. 4 shows the distribution of threshold voltages in the group of memory cells shortly after programming. The four possible two-bit data combinations are represented by four respective programming levels, having respective threshold voltage distributions 80A . . . 80D. In a certain implementation, for example, a cell whose threshold voltage is in distribution 80A is regarded as holding the data "11", a cell whose threshold voltage is in distribution 80B is regarded as holding the data "10", a memory cell whose threshold voltage is in distribution 80C is regarded as holding the data "00", and a memory cell whose threshold voltage is in distribution 80D is regarded as holding the data "01". In some embodiments, distribution 80A, which occupies negative threshold voltages, also represents erased cells.

Typically, R/W 36 retrieves the data stored in the memory cells by comparing the cells' threshold voltages to one or more read thresholds. The R/W unit usually attempts to position the read thresholds in boundary regions between adjacent distributions, so as to differentiate between the programming levels. For example, a read threshold set at $V_{TH}=0V$ can differentiate between memory cells in distribution 80A and memory cells in distribution 80B, since distribution 80A occupies a range of positive threshold voltages and distribution 80B occupies a range of negative threshold voltages.

In many memory device implementations, the R/W unit can set only non-negative read thresholds. This limitation is usually not problematic immediately after programming, but may become problematic after a certain retention period of after neighboring word lines have been programmed. Consider, for example, the middle graph of FIG. 4, which shows the threshold voltage distribution in the group of cells after a certain retention period. During the time that elapsed since the cells were programmed, the cell threshold voltages have drifted due to charge leakage from the cells. As a result, distributions 80A . . . 80D have changed to respective distributions 84A . . . 84D. As can be seen in the figure, distributions 84A . . . 84D have drifted to the left (i.e., have lower threshold voltages that the respective distributions 80A . . . 80D), and are also broader. In particular, the threshold voltages of some of the cells in distribution 84B (shown as a region 88) have drifted below $V_{TH}=0V$ and became negative.

(More strictly speaking, the horizontal axis of the middle graph of FIG. 4 (distributions 84A . . . 84D) denotes the (minimal) voltage that needs to be applied to the word line of the target cells in order to cause the string to conduct when $V_{PASS\_R}=V_{PASS\_P}$. The horizontal axis of the lower graph of FIG. 4 (distributions 92A . . . 92D) denotes the minimal voltage that needs to be applied to the word line of the target cells in order to cause the string to conduct when $V_{PASS\_R}<V_{PASS\_P}$.)

In this situation, a read threshold positioned at $V_{TH}=0V$ would not differentiate well between distributions 84A and 84B, because cells in distribution 84B whose threshold voltages are in region 88 would be erroneously associated with distribution 84A. Since R/W unit 36 is only able to use non-negative read thresholds, any read threshold setting would produce read errors. Similar broadening and/or shifting of threshold voltage distribution may also be caused by interference from other memory cells or by other kinds of impairments.

In order to retrieve the data successfully in the presence of such impairments, R/W unit 36 may reduce one or more of the pass voltages applied to the unselected word lines when reading the group of memory cells. Reducing the pass voltages applied to unselected word lines has an effect of shifting the threshold voltages of the cells in the selected word line.

This shifting effect can be modeled by an "effective read voltage" denoted $V_{EFF}$, which depends on $V_{PASS}$ and may be negative. A possible relation between $V_{EFF}$ and $V_{PASS}$ is $V_{EFF}=V_T+b\cdot V_{PASS}$. $V_T$ denotes, as defined above, the read voltage applied to the selected word line. The effect of $V_{PASS}$ of the effective gate voltage may be caused, for example, by electrical coupling between word lines (and in particular neighboring word lines), by changes in the conductance of strings 60 as a function of $V_{PASS}$, and/or by any other effect.

The effect of lowering the $V_{PASS}$ of unselected word lines is shown in the bottom graph of FIG. 4. In this graph, distributions 92A . . . 92B show the threshold voltage distribution in the group of memory cells, after lowering the pass voltage of at least one unselected word line in comparison with the pass voltage used for programming verification. In other words, the group of memory cells was programmed and verified with $V_{PASS}$ values denoted $V_{PASS\_P}$ to produce distributions 80A . . . 80D.

After retention, the memory cells are read while applying values denoted $V_{PASS\_R}$, wherein $V_{PASS\_R} < V_{PASS\_P}$ for at least one of the unselected word lines. Distributions 92A . . . 92D show the threshold voltage distributions when the memory cells are read. As can be seen in the figure, applying the reduced $V_{PASS}$ values shifts the threshold voltage distributions in the positive direction (distributions 92A . . . 92D in comparison with distributions 88A . . . 88D). In particular, unlike distribution 84B, distribution 92B now occupies an interval of positive (or at least non-negative) threshold voltages. As a result, R/W unit 36 can now differentiate between distributions 92A and 92B by positioning a read threshold at $V_{TH} = 0V$. Since region 88 is eliminated, the stored data can be read with low error probability.

In some cases, applying $V_{PASS\_R} < V_{PASS\_P}$ does not eliminate region 88 completely, i.e., does not shift distribution 92B entirely to the positive side of the threshold voltage axis. Still, even if region 88 is only reduced but not eliminated completely, applying $V_{PASS\_R} < V_{PASS\_P}$ reduces the probability of read errors considerably.

In addition to improving reading performance, the above-described technique can be used for generally differentiating between erased memory cells (e.g., cell belonging to distribution 80A) and cells that were programmed to a positive threshold voltage (e.g., cells belonging to distribution 80B) but whose threshold voltages drifted and became negative. Assume, for example, that the pass voltage used in programming verification is 6V, that the pass voltage used in data retrieval is 5V, and that the effective read voltage can be modeled as $V_{EFF} = V_T + b \cdot V_{PASS}$. In such a case, reading with reduced pass voltages enables the R/W unit to effectively set a read threshold at $-b$ volts.

Selective Application of Reduced Pass Voltages

As noted above, reading memory cells while applying reduced pass voltages to unselected word lines enables system 20 to recover threshold voltages that have drifted and became negative, and thus improve reading performance. On the other hand, reducing pass voltages indiscriminately may sometimes degrade the reading performance.

Consider, for example, a memory cell that belongs to an unselected word line and has a high threshold voltage. Such a memory cell may comprise, for example, a cell that was programmed to the programming level that is associated with the highest threshold voltages (e.g., distribution 80D in FIG. 4). In particular, such a cell may be over-programmed, i.e., programmed to an exceedingly high threshold voltage in comparison with other cells in the same programming level. Applying a reduced pass voltage to such a memory cell may reduce its conductance, because of the high threshold voltage of the cell. As a result, the conductance of the entire string may be affected, and the read operation may be distorted.

Thus, in some embodiments, R/W unit 36 applies reduced pass voltages to unselected word lines selectively. Reduced pass voltages are applied only to the memory cells whose conductance is unlikely to be affected by the pass voltage reduction. The pass voltages of the other cells (typically cells having high threshold voltages) are not reduced.

Figure 5:
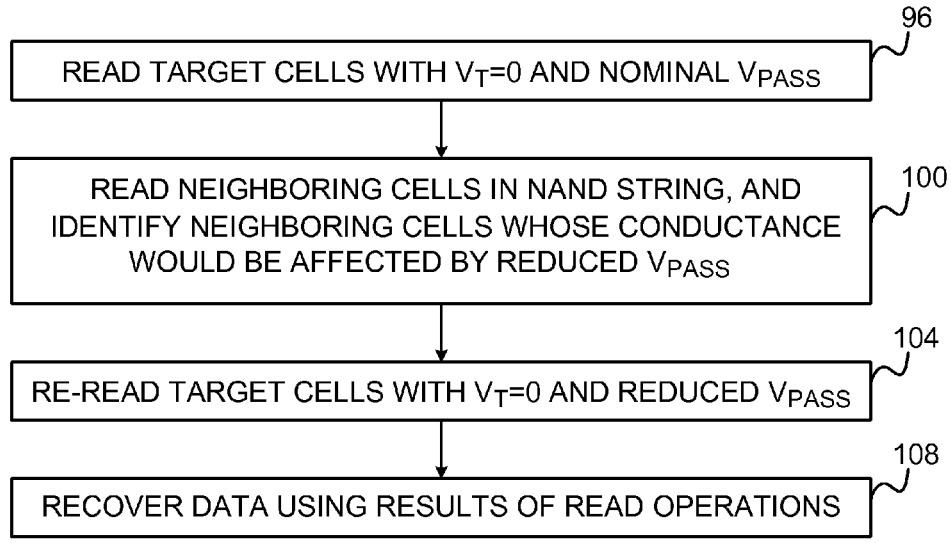

FIG. 5 is a flow chart that schematically illustrates a method for reading analog memory cells, in accordance with an embodiment of the present invention.

The method addresses the task of reading a group of memory cells with a read threshold in the vicinity of $V_T = 0V$, e.g., a task of differentiation between distributions 80A and 80B in the example of FIG. 4. The memory cells to be read are referred to as target cells, and the selected word line comprising these cells is also referred to as a target word line.

The method begins with R/W unit 36 reading the target cells, at a first reading step 96. This read operation is carried out by applying nominal pass voltages to the unselected word lines and applying $V_T = 0V$ to the selected word line (i.e., to the target cells).

The R/W unit attempts to identify memory cells in the unselected word lines, whose conductance is likely to be affected (reduced) by reducing $V_{PASS}$, at a second reading step 100. In order to identify these cells, the R/W unit reads the threshold voltages of the memory cells in one or more of the unselected word lines, typically word lines that neighbor the target word line. Based on the threshold voltages of the cells in the unselected word lines, the R/W unit identifies cells whose conductance is likely to be reduced as a result of reducing $V_{PASS}$. For example, the R/W unit may regard cells whose threshold voltages are higher than a certain predefined value as likely to be affected. This predefined value may depend on the intended reduced $V_{PASS}$ value.

The R/W unit re-reads the target cells using reduced pass voltages, at a third reading step 104. The selected word line is read with $V_T = 0V$ as in step 96 above. In the present read operation, however, the R/W unit applies reduced pass voltages to the unselected word lines. The third reading operation can be viewed, as explained above, as reading the target cells with $V_{EFF} < 0V$.

R/W unit 36 recovers the data stored in the target cells based on the results of the three read operations of steps 96-104 (which may generally be performed in any desired order), at a data recovery step 108. In other words, the R/W recovers the data of a given target cell based on (1) the read result of the target cell using nominal pass voltages, (2) the read result of the target cell using reduced pass voltages, and (3) the assessment as to whether at least one other cell in the string of the target cell is likely to distort the read operation that uses reduced pass voltages. The recovered data is typically output to MSP 40, and then to host 52. In some embodiments, step 108 can be performed by R/W unit 36 in the memory device. Alternatively, MSP 40 carries out step 108, i.e., recovers the data by using the results of the three read operations of steps 96, 100 and 104.

In some embodiments, the R/W unit classifies the target cells into four classes based on the results of the three read operations of steps 96-104:

Class A: Target cells for which the first read operation concluded that $V_{TH} > 0$. For these cells, the second and third read operations usually do not contribute useful information.

Class B: Target cells for which (1) the first read operation concluded that $V_{TH} < 0$, and (2) the second read operation identified at least one cell in the same string that is likely to be affected by reducing $V_{PASS}$. For these cells, the third read operation (with reduced $V_{PASS}$) typically cannot be relied upon. In other words, the threshold voltage of these cells is known to be negative, but they cannot be read reliably with reduced $V_{PASS}$ to determine whether they are higher or lower than $V_{EFF}$.

Class C: Target cell for which (1) the first read operation concluded that $V_{TH}<0$, (2) the second read operation did not identify any cells in the same string that is likely to be affected by reducing $V_{PASS}$, and (3) the third read operation concluded that $V_{TH}>V_{EFF}$. In other words, for these cells it is known that $V_{EFF}<V_{TH}<0$.

Class D: Target cell for which (1) the first read operation concluded that $V_{TH}<0$, (2) the second read operation did not identify any cells in the same string that is likely to be affected by reducing $V_{PASS}$, and (3) the third read operation concluded that $V_{TH}<V_{EFF}$. In other words, for these cells it is known that $V_{TH}<V_{EFF}<0$.

The R/W unit recovers the data from a given target cell based on the class with which the target cell is associated. The R/W unit may apply any suitable decoding scheme that depends on the cell classification. In FIG. 4 above, for example, assume that distribution 80A (as well as 84A and 92A) is associated with a data value D1, and that distribution 80B (as well as 84B and 92B) is associated with a data value D2. The R/W unit may apply the following decoding logic:

TABLE 1

Example decoding logic

| Class of target cell | Decoding decision |
|---|---|
| A | D2, possibly with high confidence level |
| B | D1, possibly with low confidence level |
| C | D2, possibly with medium confidence level |
| D | D1, possibly with high confidence level |

In some embodiments, the R/W unit assigns a certain confidence level to the read result of each target cell, based on the read operations using nominal and reduced $V_{PASS}$, and on the assessment as to the likelihood of distortion caused by reducing $V_{PASS}$. In the present example, the R/W unit assigns the confidence level based on the class with which the target cell is associated. The final decision as to the data stored in the target cells may depend on the respective confidence levels assigned to the cells. Various kinds of confidence levels, such as Likelihood Ratios (LRs) or Log-Likelihood Ratios (LLRs), can be used for this purpose.

In some embodiments, MSP 40 encodes the data with an Error Correction Code (ECC) before it is stored in memory device 24, and decodes the ECC of data retrieved from the memory device. In these embodiments, the ECC decoding process carried out by the MSP may consider the confidence levels assigned to the target cells. In other words, the values read from target cells having high confidence levels are given higher weight in the ECC decoding process, in comparison with values read from target cells having low confidence levels. In an example embodiment, target cells having low confidence levels are marked as "erasures," i.e., missing values, to the ECC decoding process. The ECC decoding process decodes the ECC using the erasure indications. Some ECC types, e.g., Reed-Solomon (RS) codes, achieve considerably superior decoding performance when provided with erasure indications. Other ECC types operate on soft confidence levels, such as LLRs.

Alternatively, the R/W unit may select, for each cell, whether to use (output) the read result of step 96 or of step 104, based on the class with which the cell is associated.

Figure 6:
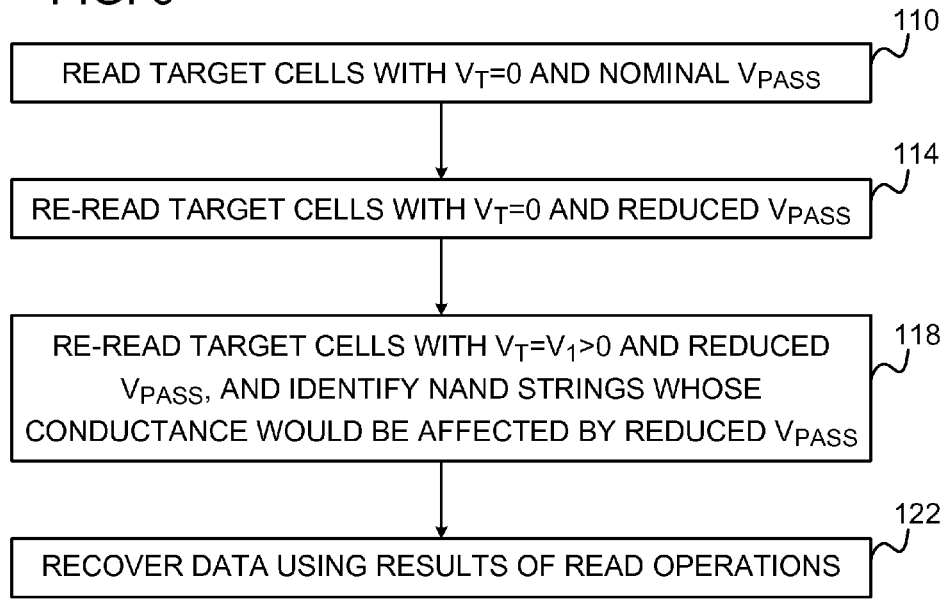

FIG. 6 is a flow chart that schematically illustrates another method for reading analog memory cells, in accordance with an alternative embodiment of the present invention. This method differs from the method of FIG. 5 above in the way in which R/W unit 36 identifies which cells belong to strings that are likely to be affected by reducing $V_{PASS}$.

The method of FIG. 6 begins with R/W unit 36 reading the target cells, at a reading step 110. As in step 96 of FIG. 5 above, in this read operation the R/W unit applies nominal pass voltages to the unselected word lines and $V_T=0V$ to the selected word line (i.e., to the target cells). The R/W unit re-reads the target cells using reduced pass voltages, at a re-reading step 114. In this read operation, the selected word line is read with $V_T=0V$, and the unselected word lines are biased with reduced pass voltages. This reading operation can thus be viewed as reading the target cells with $V_{EFF}<0V$.

The R/W unit attempts to identify one or more strings, whose conductance is likely to be affected (reduced) by reducing $V_{PASS}$, at a string assessment step 118. In order to identify such strings, the R/W unit re-reads the target memory cells with a read voltage that is higher than 0V, i.e., using $V_T=V_1>0V$. The unselected word lines are biased with the reduced pass voltages during this read operation.

Assume that, for a given target cell, the R/W unit reads $V_{TH}<0$ at step 110 (using nominal pass voltages and $V_T=0$), but reads $V_{TH}>V_1$ at step 118 (using reduced pass voltages and $V_T=V_1$). This sort of result indicates that the string of this target cell contains at least one memory cell that stopped conducting as a result of reducing $V_{PASS}$. Thus, R/W unit 36 may use this technique to identify strings whose conductance is likely to be affected (reduced) by reducing $V_{PASS}$.

R/W unit 36 recovers the data stored in the target cells based on the results of the three read operations of steps 110-118 (which may be performed in any desired order), at a recovery step 122. In other words, the R/W recovers the data of a given target cell based on (1) the read result of the target cell using nominal pass voltages, (2) the read result of the target cell using reduced pass voltages, and (3) the assessment as to which strings are likely to distort the read operation that uses reduced pass voltages. The recovered data is typically output to MSP 40, and then provided to host 52.

In some embodiments, the R/W unit classifies the target cells into four classes based on the results of the three read operations of steps 110-118:

Class A: Target cells for which the first read operation concluded that $V_{TH}>0$.

Class B: Target cells for which (1) the first read operation concluded that $V_{TH}<0$, and (2) the third read operation concluded that $V_{TH}>V_1$.

Class C: Target cell for which (1) the first read operation concluded that $V_{TH}<0$, (2) the second read operation concluded that $V_{TH}>V_{EFF}$, and (3) the third read operation concluded that $V_{TH}<V_1$, i.e., that the string of the target cell is unlikely to stop conducting as a result of reducing $V_{PASS}$. In other words, for these cells it is known that $V_{EFF}<V_{TH}<0$.

Class D: Target cell for which (1) the first read operation concluded that $V_{TH}<0$, (2) the second read operation concluded that $V_{TH}<V_{EFF}$, and (3) the third read operation concluded that $V_{TH}<V_1$, i.e., that the string of the target cell is unlikely to stop conducting as a result of reducing $V_{PASS}$. In other words, for these cells it is known that $V_{TH}<V_{EFF}<0$.

In some embodiments, R/W unit 36 recovers the data from a given target cell based on the class with which the target cell is associated. The R/W unit may apply any suitable decoding scheme that depends on the cell classification, such as the decoding logic given in Table above. In this example too, the R/W unit may assign respective confidence levels (e.g., LLRs) to the read results of the target cells based on the read operations using nominal and reduced $V_{PASS}$, and on the assessment as to the likelihood of distortion caused by reducing $V_{PASS}$. In particular, the R/W unit may assign a confidence level to a given target cell based on the class with which the cell is associated. The MSP may decode the data (e.g., apply ECC decoding) based on the confidence levels, as explained above. Alternatively, the R/W unit may select, for each cell, whether to use (output) the read result of step 110 or of step 114, based on the class with which the cell is associated.

In some embodiments, the R/W unit may carry out steps 114 and 118 of FIG. 6 using a single read operation, which uses two read thresholds simultaneously. For example, some MLC devices support a read command, which compares the cell storage values to two read thresholds simultaneously. The read results of this read command indicate whether each storage value falls below both read thresholds, above both read thresholds or between the two read thresholds. Thus, the R/W unit may carry out steps 114 and 118 jointly by setting one read threshold to $V_T=0V$ and the other to $V_T=V_1$. The unselected word lines are biased with reduced pass voltages during the read operation.

The methods of FIGS. 5 and 6 above can be applied in an iterative manner, in which the R/W unit reduces the $V_{PASS}$ value from one iteration to the next. This sort of process attempts to find the lowest $V_{PASS}$ values (and thus the lowest $V_{EFF}$) for which the target cells can still be read reliably. The iterative process may be terminated (by the R/W unit or by the MSP) using any suitable stopping condition. For example, the R/W unit may stop lowering the pass voltages upon receiving an indication that the number of errors corrected by the ECC is too high, that ECC decoding has failed, or that an error detection code (e.g., Cyclic Redundancy check—CRC) has failed. As another example, the MSP or R/W unit may hold the (known or estimated) number of memory cells that were programmed to the negative programming state (e.g., in distribution 80A of FIG. 4), count the number of cells whose threshold voltages are currently negative (the cells in distribution 84A, plus the cells in region 88), and stop lowering pass voltages when the two numbers are sufficiently close to one another. This latter comparison can also be used for initiating the iterative process. As yet another example, the R/W unit may stop the iterative process when the number (or percentage) of non-conducting strings becomes too large, or after a predefined maximum number of iterations.

In some embodiments, system 20 may modify the pass voltages, either iteratively or not, only in response to a failure to reconstruct the data using the nominal pass voltages. Such a failure may be detected, for example, using ECC or CRC failure, or using any other suitable means.

The methods of FIGS. 5 and 6 may achieve reliable data readout with very low $V_{PASS}$ values. Consider, for example, an array of eight-level memory cells, which are programmed to threshold voltages in the range of 0-3V. The nominal pass voltage in such an array would be on the order of 5V, in order to minimize the likelihood that a cell in an unselected word line would stop conducting due to over-programming. The disclosed techniques enable the R/W unit to reduce the pass voltage to around 4V, while maintaining a very low probability that a cell in an unselected word line will stop conducting. Even when the pass voltage is reduced to 3V, the majority of the cells in the unselected word lines will conduct (with the exception of the cells that are intentionally programmed to threshold voltages around 3V and cells that suffer from severe over-programming). Thus, the majority of cells can be read reliably with a negative effective read voltage. In any case, the disclosed techniques fall back to the nominal pass voltages in the event that a string does stop conducting.

In alternative embodiments, system 20 may use any other suitable technique that includes:

1. Reading a target memory cell while biasing the other memory cells in the string using nominal pass voltages.
2. Re-reading the target memory cell while biasing the other memory cells in the string using modified pass voltages, at least one of which is different from the corresponding nominal pass voltage.
3. Reconstructing the data based on the two read operations.

Setting Pass Voltages Based on Word Line Programming Status

In a typical N bits/cell MLC device, a given word line may be programmed with less than N bits per cell at a certain point in time. A memory cell or group of cells that are programmed with less than the maximum specified number of bits per cell is referred to as partially programmed. A memory cell or group of cells that are programmed with the maximum specified number of bits per cell is referred to as fully programmed.

Each MLC programming level (programming state) is associated with a certain range of threshold voltages (or other form of storage values). Typically, a partially-programmed word line does not occupy the (one or more) highest threshold voltage ranges. In the 2 bits/cell configuration of FIG. 4, for example, a given word line can be partially programmed with only one bit per cell by populating only programming levels 80A and 80B. At a later point in time, this word line may be programmed with the second bit by populating all four programming levels 80A . . . 80D, thus reaching the full 2 bits/cell density. As can be appreciated, the memory cells of a partially-programmed word line typically have relatively low threshold voltages. Thus, a memory cell in a partially-programmed word line is extremely unlikely to be affected by reduced pass voltage.

In some embodiments, when intending to read a certain target word line, R/W unit 36 selects whether to apply a nominal or different (e.g., reduced) pass voltage to a given unselected word line based on the programming status of this word line. Partially-programmed unselected word lines can usually be biased with low pass voltages, with little or no risk of affecting string conductance. Fully-programmed unselected word lines have a higher probability of affecting string conductance, e.g., because of cell over-programming, and are therefore biased with nominal pass voltages. An erased word line is also regarded as partially programmed in this context.

FIG. 7 is a flow chart that schematically illustrates a method for reading analog memory cells, in accordance with an embodiment of the present invention. The method begins with R/W unit 36 checking whether a given unselected word line is erased or partially programmed, at a programming status checking step 130. If not, i.e., if the word line is fully programmed, the R/W unit applies a nominal $V_{PASS}$ value to the word line, at a nominal biasing step 134. If the word line is erased or partially programmed, the R/W unit applies a reduced $V_{PASS}$ value to the word line, at a reduced biasing step 138. R/W unit 36 typically repeats the process of steps 130-138 for each unselected word line. The R/W unit reads the target word line while the unselected word lines are biased with the appropriate pass voltages, at a reading step 142.

The method of FIG. 7 enables the memory device to reduce at least some of the pass voltages, with little or no effect on reading performance. Unlike the methods of FIGS. 5 and 6 above, selective application of reduced pass voltages can be performed without additional read operations. For example, the R/W unit or MSP may keep a record as to how many bits per cell are programmed in each word line.

Memory Cell Pre-Programming to Intermediate Negative Programming Level

In some embodiments, R/W unit 36 pre-programs the memory cells of a certain erased word line to an intermediate level before storing data in the cells. For example, the cells in an erased word line may have threshold voltages in the range of −4V to −1V. Before storing data in these cells, the R/W unit may pre-program the cells to an intermediate programming level having threshold voltages in the range of −1.5V to −0.5V. This intermediate level typically occupies a range of negative threshold voltages, and is usually more compact (narrower) that the erased level. The above-mentioned voltage ranges are given purely by way of example, and any other suitable values can be used.

Pre-programming memory cells to an intermediate level has a number of advantages. For example, since the intermediate level occupies higher threshold voltages and is more compact than the erased level, the additional threshold voltage gained during data programming is smaller and more accurate. Thus, the resulting threshold voltage distributions are typically narrower. In addition, when using a Programming and Verification (P&V) process, the P&V process inherently compensates for cross-coupling interference that is already present when the cells are programmed. When a neighboring word line of a certain target word line is pre-programmed to an intermediate level, it already contributes some cross-coupling interference to the target word line. When the target word line is programmed, this interference component is inherently compensated for.

On the other hand, pre-programming a group of memory cells to an intermediate negative level typically involves setting a verification threshold to a negative value. Setting a negative read threshold is often unfeasible in many memory device configurations. As explained above, however, applying reduced pass voltages to unselected word lines can be viewed as setting a negative read threshold. In some embodiments, the R/W unit pre-programs the memory cells in a certain target word line to an intermediate negative level, and verifies the pre-programming by applying different (e.g., reduced) pass voltages to one or more unselected word lines.

FIG. 8 is a flow chart that schematically illustrates a method for pre-programming a certain erased word line, in accordance with an embodiment of the present invention. The method begins with R/W unit 36 pre-programming the memory cells of the erased word line (referred to as a target word line) to an intermediate level of negative threshold voltages, at a pre-programming step 150. The R/W unit applies a read voltage of $V_T=0$ to the erased word line, and $V_{PASS}=0$ to one or more of the unselected word lines (usually neighboring word lines). Alternatively, any other suitable small positive values of $V_T$ and small positive values of $V_{PASS}$ can also be used, such as 4V. This sort of biasing is equivalent to biasing the unselected word lines with nominal pass voltages and setting a negative value of $V_T$. After biasing the word lines, the R/W unit pre-programs the memory cells of the target word line, e.g., using an iterative P&V process.

The verification thresholds used in this programming process are non-negative, but are equivalent to negative verification thresholds due to the biasing scheme used. As a result, the cells of the target word line assume threshold voltages that fall in a relatively narrow range (e.g., −1.5V to −0.5V) of negative threshold voltages. At a later point in time, the R/W unit programs the pre-programmed word line with data, at a data programming step 158.

The pre-programming process of FIG. 8 may be performed at any stage during the memory cells' life cycle. In some embodiments, the target word line is pre-programmed before its neighboring word lines are programmed. At that stage, applying low $V_{PASS}$ values to the neighboring word lines is unlikely to affect string conductance.

Setting Pass Voltage as a Function of Read Voltage

Multi-level memory cells are typically read by performing multiple read operations using different read voltages (read thresholds) $V_T$, which are positioned in the boundary regions between adjacent programming levels. In the configuration of FIG. 4 above, for example, the memory cells can be read using three read voltages. One read voltage would be positioned between distributions 92A and 92B, another read voltage would be positioned between distributions 92B and 92C, and a third read voltage would be positioned between distributions 92C and 92D.

In some embodiments, R/W unit 36 sets the $V_{PASS}$ values of at least one unselected word line depending on the read voltage $V_T$. Typically although not necessarily, the $V_{PASS}$ value is increased as $V_T$ increases. In the configuration of FIG. 4, for example, a read operation whose $V_T$ is between distributions 92C and 92D would use a larger $V_{PASS}$ value than a read operation whose $V_T$ is between distributions 92B and 92C. This dependence can be applied in data readout operations as well as in programming verification operations.

This technique is advantageous, for example, in memory devices in which the maximum value of $V_T$ that can be applied to a word line is limited. Such a limit may be caused, for example, by the word line biasing circuitry or for any other reason. In this sort of situation, increasing the $V_{PASS}$ of one or more unselected word lines as a function of $V_T$ can increase the effective read voltage $V_{EFF}$ beyond the maximum value of $V_T$ that can be applied to the selected word line. As a result, the achievable range of threshold voltages ("the threshold voltage window") is not limited by the word line biasing circuitry and can be increased to improve performance.

The R/W unit may set the value of $V_{PASS}$ based on $V_T$ according to any suitable function or dependence. For example, the dependence may be linear, i.e., $V_{PASS}=V_0+a \cdot V_T$. When $V_{EFF}$ is given by $V_{EFF}=V_T+b \cdot V_{PASS}$, this linear dependence increases the threshold voltage range by a factor of $1+a \cdot b$. Alternatively, any other suitable dependence can also be used.

FIG. 9 is a flow chart that schematically illustrates a method for reading a word line of multi-level analog memory cells (referred to as a target word line), in accordance with an embodiment of the present invention. In this method, R/W unit 36 reads the multi-level cells by applying a sequence of read operation, each with a different read voltage.

The method begins with R/W unit 36 setting a read voltage $V_T$ for reading the target word line, at a read voltage setting step 160. The R/W unit sets the $V_{PASS}$ values of one or more unselected word lines (e.g., word lines that neighbor the target word line) based on the $V_T$ value to be used, at a pas voltage setting step 164. Any dependence of $V_{PASS}$ on $V_T$, such as the linear dependence defined above, can be used. The R/W unit then reads the memory cells in the target word line using the set values of $V_{PASS}$ and $V_T$, at a word line reading step 168.

The R/W unit checks whether additional read operations are to be performed as part of the multi-level read sequence, at a read completion checking step 172. If all read operations are completed, the R/W unit outputs the read results to MSP 40, at an output step 176, and the method terminates. Otherwise, the method loops back to step 160 above, in which the R/W unit prepares for the next read operation and sets the VT value accordingly.

Improving Read Voltage Resolution Using Pass Voltage Adjustment

In some embodiments, the read voltage (or read threshold) generation circuitry in R/W unit 36 is able to produce VT at a limited resolution. In these embodiments, the R/W unit can read memory cells in a certain word line at a finer resolution, by adjusting the pass voltages of one or more unselected word lines. In other words, when a read threshold is settable only at a certain resolution, the R/W unit jointly sets the read threshold and one or more pass voltages, so as to sense the cell threshold voltages at a finer resolution.

Consider, for example, a memory device that is able to generate read voltages (read thresholds) at 30 mV steps. In such a device, it may be desirable to check if a certain memory cell becomes conductive at $V_T=3.07V$ and $V_{PASS}=7V$. Assume also that in this memory device the effective read voltage is given by $V_{EFF}=V_T+0.1 \cdot V_{PASS}$. In order to produce equivalent conditions to $V_{EFF}=3.07V$ and $V_{PASS}=7V$, the R/W unit may set $V_T=3V$ and $V_{PASS}=7.07V$, or alternatively set $V_T=3.03V$ and $V_{PASS}=6.77V$. In both cases, the effective read voltage is set at high resolution even though $V_T$ is set at 30 mV granularity.

Additional Embodiments and Variations

The methods described throughout this patent application manipulate the pass voltages of one or more unselected word lines, in order to read a certain selected (target) word line. In all of these methods, pass voltage adjustment can be applied to any desired subset of one or more unselected word lines. In some embodiments, pass voltage modification is applied to one or both word lines that are direct neighbors of the selected word line. Modifying the pass voltages of direct neighbors is often preferable because:

The impact of the pass voltages of neighboring word lines on the effective read voltage of the target word line is usually dominant. The effect of more distant word lines is often weaker.

Memory devices are often programmed in monotonic (ascending or descending) order of word lines. In some devices, the programming order alternates back and forth between word lines and applies partial programming at each stage. In either case, when a given word line is programmed and verified, one or both neighboring word lines are likely to be partially-programmed or not programmed at all. Applying reduced pass voltages to the partially-programmed word lines is unlikely to affect string conductance.

Nevertheless, pass voltage modification may be applied to any desired set of unselected word lines, or even to all word lines. Generally, different word lines may be biased with different or similar pass voltages, as desired.

In some cases, implementing circuitry that applies multiple different voltages to different word lines may complicate the design of the R/W unit and may also cause performance degradation (e.g., increase reading time). In an example embodiment, the R/W unit design can be simplified by applying the read voltage $V_T$ both to the selected (target) word line and to one or both neighbor word lines. Since $V_T$ is typically lower than the nominal $V_{PASS}$, applying $V_T$ to an unselected word line is equivalent to reducing its pass voltage. Biasing a neighboring word line with $V_T$ has the advantage of eliminating the circuitry needed for generating an additional voltage value. This technique is particularly applicable when the neighbor word line is not yet programmed or partially-programmed, as explained above.

In the embodiments described herein, the $V_{PASS}$ modification process is carried out by R/W unit 36 internally to the memory device. This configuration was described, however, purely for the sake of conceptual clarity. The methods and systems described herein are in no way limited to implementation internally to the memory device circuitry. In alternative embodiments, some or all of the $V_{PASS}$ modification process can be carried out by MSP 40 or other controller that is separate from the memory device. For example, the MSP may determine the $V_{PASS}$ voltages to be applied in a given read operation and indicate these voltages to the memory device. In some embodiments, the memory device and MSP support a command interface, which comprises one or more commands that instruct the memory device to apply certain pass voltages. These commands may specify, for example, the pass voltages to be applied and/or the word lines to which they are to be applied. Any of the methods described in this patent application can be partitioned between the memory device and the MSP (or other controller, or the host) in any desired manner.

In some of the embodiments described herein, a group of memory cells are read with $V_T=0V$ and a reduced $V_{PASS}$, because $V_T=0V$ is the lowest read voltage that can be set by the memory device. Some memory devices, however, may have a minimal $V_T$ that is somewhat larger than 0V. Thus, in alternative embodiments, the R/W unit may read the memory cells with $V_T=\epsilon>0$ and reduced $V_{PASS}$, wherein $\epsilon$ denotes the minimum readable storage value, i.e., the lowest value of read voltage that is supported by the memory device circuitry.

Another possible way to increase the observable threshold voltage of a given target word line is to bias a neighboring word line with a pass voltage that is in the vicinity of its threshold voltage. Thus, in an embodiment, the R/W unit may read a target word line by (1) programming all the cells of a neighboring word line to a compact range of storage values, (2) biasing the neighboring word line with a pass voltage in the vicinity of this range, and (3) reading the target word line.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
    storing data in a target analog memory cell, which is one of a group of analog memory cells that are connected in series with one another, by writing a storage value into the target memory cell;
    verifying the storage value written into the target memory cell while biasing the other memory cells in the group with respective first pass voltages;
    after writing and verifying the storage value, reading the storage value from the target memory cell while biasing the other memory cells in the group with respective second pass voltages, wherein at least one of the second pass voltages applied to one of the other memory cells in the group is lower than a respective first pass voltage applied to the one of the other memory cells; and reconstructing the data responsively to the read storage value.

2. The method according to claim 1, wherein the analog memory cells comprise NAND Flash memory cells, and wherein the group of the analog memory cells comprises a NAND string.

3. The method according to claim 1, wherein biasing the other memory cells in the group comprises applying the lower at least one of the second pass voltages to a memory cell that neighbors the target memory cell.

4. The method according to claim 1, wherein biasing the other memory cells comprises identifying a subset of the other memory cells in the group, which are unlikely to affect an electrical conductance of the group when biased with the lower at least one of the second pass voltages, and selectively applying the lower at least one of the second pass voltages only to the memory cells in the subset.

5. The method according to claim 4, wherein the memory cells comprise multi-level analog memory cells that are each configured to store a predefined number of bits, and wherein identifying the subset comprises identifying the memory cells in the group that store less than the predefined number of bits.

6. The method according to claim 4, wherein the memory cells comprise multi-level analog memory cells that are each programmed to one of multiple predefined storage value ranges, and wherein identifying the subset comprises identifying the memory cells in the group that are programmed to less than a highest range among the storage value ranges.

7. The method according to claim 1, wherein, at a time of reading the storage value from the target memory cell while biasing the one of the other memory cells with the first pass voltage, the storage value is lower than a minimum readable value, and wherein biasing the one of the other memory cells with the second pass voltage comprises reducing the minimum readable value.

8. The method according to claim 7, wherein the minimum readable value comprises zero while biasing the one of the other memory cells with the first pass voltage.

9. The method according to claim 7, wherein reading the storage value comprises sensing an electrical conductance of the group of the memory cells while applying a non-negative read voltage to the target memory cell.

10. The method according to claim 1, wherein reading the storage value comprises applying a read voltage to the target memory cell, and wherein biasing the other memory cells comprises setting the at least one of the second pass voltages depending on the read voltage.

11. The method according to claim 1, wherein reading the storage value comprises applying a read voltage to the target memory cell, and wherein biasing the other memory cells comprises applying the read voltage to the one of the other memory cells.

12. The method according to claim 1, and comprising applying the lower at least one of the second pass voltages only responsively to a failure to reconstruct the data while biasing the other memory cells in the group with the first pass voltages.

13. The method according to claim 1, wherein the memory cells are comprised in a memory device, and wherein biasing the other memory cells comprises instructing the memory device, using a processor separate from the memory device, to apply the at least one of the second pass voltages.

14. The method according to claim 1, wherein biasing the other memory cells comprises programming a neighboring memory cell in the group to a given storage value, and biasing the neighboring memory cell with a given pass voltage in a vicinity of the given storage value.

15. A method, comprising:
reading an output storage value from a target memory cell in a group of memory cells that are connected in series, wherein the reading includes biasing one of the other memory cells in the group with a pass voltage that is based on a storage value of the other memory cell.

16. The method according to claim 15,
wherein the setting comprises:
determining that the one of the other memory cells is programmed to the storage value and that a second one of the other memory cells is programmed to a second storage value;
setting the pass voltage to a first value based on the determining;
setting a second pass voltage to a second value based on the determining, wherein the second pass voltage biases the second one of the other memory cells;
wherein the first value is lower than the second value, and wherein the storage value is lower than the second storage value.

17. The method according to claim 15, wherein the memory cells comprise multi-level NAND Flash memory cells, and wherein the group of memory cells comprises a NAND string.

18. A method, comprising:
reading an output storage value from a target memory cell in a group of memory cells that are connected in series;
wherein the reading includes:
applying a read threshold to the target memory cell; and
biasing one of the other memory cells in the group with a pass voltage that is based on the read threshold.

19. The method according to claim 18, wherein the memory cells comprise multi-level NAND Flash memory cells, and wherein the group of memory cells is arranged in a NAND string.

20. The method according to claim 18, wherein the other memory cell neighbors the target memory cell.

21. An apparatus, comprising:
an interface, configured to communicate with a memory comprising a group of memory cells that are connected in series; and
circuitry, configured to:
store data in a target analog memory cell in the group by writing a storage value into the target memory cell;
verify the storage value written into the target memory cell while biasing the other memory cells in the group with respective first pass voltages; and
read the storage value from the target memory cell, after writing and verifying the storage value, wherein, to read the storage value, the circuitry is configured to bias the other memory cells in the group with respective second pass voltages;
wherein one of the second pass voltages applied to one of the other memory cells in the group is lower than a respective first pass voltage applied to the one of the other memory cell.

22. The apparatus according to claim 21, wherein the analog memory cells comprise NAND Flash memory cells, and wherein the group of the analog memory cells is arranged as a NAND string.

23. The apparatus according to claim 21, wherein the circuitry is configured to apply the one of the second pass voltages to a memory cell that neighbors the target memory cell.

24. The apparatus according to claim 21, wherein the circuitry is configured to identify a subset of the other memory cells in the group and to selectively apply the one of the second pass voltages to the memory cells in the subset.

25. The apparatus according to claim 24, wherein the memory cells comprise multi-level analog memory cells that are configured to store a predefined number of bits, and wherein the circuitry is configured to identify the subset by identifying memory cells in the group that store less than the predefined number of bits.

26. The apparatus according to claim 24, wherein the memory cells comprise multi-level analog memory cells that are programmed to one of multiple predefined storage value ranges, and wherein the circuitry is configured to identify the subset by identifying memory cells in the group that are programmed to a storage value range that is lower than a highest range among the storage value ranges.

27. The apparatus according to claim 21, wherein the circuitry is configured to reduce a minimum readable value associated with the target cell by biasing the one of the other memory cells with the second pass voltage.

28. The apparatus according to claim 27, wherein the minimum readable value is zero when the one of the other memory cells is biased with the first pass voltage.

29. The apparatus according to claim 27, wherein, to read the storage value, the circuitry is configured to sense an electrical conductance of the group of the memory cells while applying a non-negative read voltage to the target memory cell.

30. The apparatus according to claim 21, wherein the circuitry is configured to read the storage value by applying a read voltage to the target memory cell, and to set the one of the second pass voltages based on the read voltage.

31. The apparatus according to claim 21, wherein the circuitry is configured to read the storage value by applying a read voltage to the target memory cell, and to apply the read voltage to the one of the other memory cells as the one of the second pass voltages.

32. The apparatus according to claim 21, wherein the circuitry is configured to:
reconstruct the data responsively to the read storage value; and
apply the one of the second pass voltages in response to a failure to reconstruct the data while biasing the other memory cells in the group with the first pass voltages.

33. The apparatus according to claim 21, wherein the circuitry comprises:
a read/write unit, comprised in a memory device comprising the memory cells; and
a processor, configured to instruct the R/W unit to apply the one of the second pass voltages, wherein the processor is separate from the memory device.

34. The apparatus according to claim 21, wherein the circuitry is configured to read the storage value from the target memory cell by programming a neighboring memory cell in the group to a given storage value and biasing the neighboring memory cell with a given pass voltage that corresponds to the given storage value.

35. An apparatus, comprising:
an interface configured to communicate with a memory comprising a group of multi-level memory cells connected in series; and
circuitry, which is configured to:
read an output storage value from a target memory cell in the group, wherein, to read the output storage value, the circuitry is configured to bias one of the other memory cells in the group with a pass voltage that is based on a value stored in one of the other memory cells.

36. The apparatus according to claim 35, wherein the circuitry is configured to set the pass voltage to a first value based on determining that the one of the other memory cells is programmed to a first storage value, and to set the pass voltage to a second value that is lower than the first value, based on determining that the one of the other memory cells is programmed to a second storage value that is lower than the first storage value.

37. The apparatus according to claim 35, wherein the memory cells comprise multi-level NAND Flash memory cells, and wherein the group of memory cells is arranged as a NAND string.

38. An apparatus, comprising:
an interface, configured to communicate with a memory comprising a group of memory cells that are connected in series; and
circuitry, configured to:
read an output storage value from a target memory cell in the group using a read voltage;
wherein, to read the output storage value, the circuitry is configured to bias one of the other memory cells in the group with a pass voltage that depends on the read voltage.

39. The apparatus according to claim 38, wherein the memory cells comprise multi-level NAND Flash memory cells, and wherein the group of memory cells is arranged in a NAND string.

40. The apparatus according to claim 38, wherein the one of the other memory cells neighbors the target memory cell.

* * * * *